(12) United States Patent
Maki

(10) Patent No.: US 10,991,866 B2
(45) Date of Patent: Apr. 27, 2021

(54) LIGHT EMITTING MODULE

(71) Applicant: TOSHIBA HOKUTO ELECTRONICS CORPORATION, Asahikawa (JP)

(72) Inventor: Keiichi Maki, Asahikawa (JP)

(73) Assignee: Toshiba Hokuto Electronics Corporation, Asahikawa (JP)

( * ) Notice: Subject to any disclaimer, the term of this patent is extended or adjusted under 35 U.S.C. 154(b) by 0 days.

(21) Appl. No.: 16/730,202

(22) Filed: Dec. 30, 2019

(65) Prior Publication Data

US 2020/0168588 A1    May 28, 2020

Related U.S. Application Data

(63) Continuation of application No. 15/269,021, filed on Sep. 19, 2016, now Pat. No. 10,580,949, which is a (Continued)

(30) Foreign Application Priority Data

Sep. 26, 2014 (JP) .................. 2014-196381

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 27/153* (2013.01);
(Continued)

(58) Field of Classification Search
CPC .... H01L 33/62; H01L 25/0753; H01L 27/153
See application file for complete search history.

(56) References Cited

U.S. PATENT DOCUMENTS 7,478,925 B2  1/2009  Hiyama et al.
7,878,680 B2  2/2011  Fujino et al.
(Continued)

FOREIGN PATENT DOCUMENTS

JP    60-062168 A1    4/1985
JP    60-262430 A1    12/1985
(Continued)

OTHER PUBLICATIONS

Japanese Office Action (Application No. 2016-549954) dated Mar. 24, 2020 (with English translation).
(Continued)

*Primary Examiner* — Errol V Fernandes
*Assistant Examiner* — Jeremy J Joy
(74) *Attorney, Agent, or Firm* — Burr & Brown, PLLC

(57) ABSTRACT

A light emitting module according to an embodiment includes a first insulation film and a second insulation film with a light transmissivity, a plurality of first double-sided light emitting elements disposed between the first insulation film and the second insulation film, and each including a pair of electrodes on one surface, a plurality of second double-sided light emitting elements disposed between the first insulation film and the second insulation film adjacent to the respective first double-sided light emitting elements, each including a pair of electrodes on one surface, and emitting different light from the first double-sided light emitting element.

8 Claims, 17 Drawing Sheets

Related U.S. Application Data continuation of application No. PCT/JP2015/004815, filed on Sep. 18, 2015.

(51) Int. Cl.
    *H01L 27/15*     (2006.01)
    *H01L 33/44*     (2010.01)
    *H01L 33/38*     (2010.01)

(52) U.S. Cl.
    CPC .............. *H01L 33/44* (2013.01); *H01L 33/38* (2013.01); *H01L 2224/16225* (2013.01)

(56) References Cited

U.S. PATENT DOCUMENTS

| | | | |
|---|---|---|---|
| 7,952,107 B2 | 5/2011 | Daniels et al. | |
| 8,044,415 B2 | 10/2011 | Messere et al. | |
| 9,306,132 B2 | 4/2016 | Maki | |
| 2003/0189829 A1* | 10/2003 | Shimizu | H05B 45/00 362/240 |
| 2004/0075399 A1* | 4/2004 | Hall | H01L 25/0753 315/291 |
| 2006/0092634 A1* | 5/2006 | Hiyama | G09F 13/22 362/231 |
| 2008/0143916 A1* | 6/2008 | Fujino | G02F 1/133611 349/58 |
| 2008/0179602 A1* | 7/2008 | Negley | H01L 21/2654 257/88 |
| 2009/0114928 A1* | 5/2009 | Messere | B32B 17/10541 257/88 |
| 2010/0052189 A1* | 3/2010 | Sakurai | H05K 3/321 257/778 |
| 2011/0193105 A1* | 8/2011 | Lerman | H01L 33/08 257/88 |
| 2012/0113328 A1* | 5/2012 | Takeshima | G02F 1/133603 348/739 |
| 2012/0256187 A1* | 10/2012 | Yu | H01L 27/153 257/76 |
| 2013/0248916 A1* | 9/2013 | Suehiro | H01L 24/17 257/99 |
| 2014/0362565 A1* | 12/2014 | Yao | H01L 25/0753 362/223 |
| 2015/0060905 A1* | 3/2015 | Nam | H01L 33/60 257/89 |
| 2015/0249069 A1* | 9/2015 | Yoshida | H01L 33/505 257/89 |
| 2016/0013376 A1 | 1/2016 | Maki | |
| 2016/0027973 A1 | 1/2016 | Maki | |
| 2016/0155913 A1 | 6/2016 | Maki | |
| 2016/0233399 A1 | 8/2016 | Maki | |
| 2016/0276322 A1* | 9/2016 | Maki | H01L 33/56 |

FOREIGN PATENT DOCUMENTS

| | | |
|---|---|---|
| JP | 61-006833 A1 | 1/1986 |
| JP | 61-194732 A1 | 8/1986 |
| JP | 10-163536 A1 | 6/1998 |
| JP | 11-145381 A1 | 5/1999 |
| JP | 11-177147 A1 | 7/1999 |
| JP | 2000-227952 A1 | 8/2000 |
| JP | 2000-299411 A1 | 10/2000 |
| JP | 2002-246418 A1 | 8/2002 |
| JP | 2006-041113 A1 | 2/2006 |
| JP | 2006-134992 A1 | 5/2006 |
| JP | 2008-028171 A1 | 2/2008 |
| JP | 2008-034473 A1 | 2/2008 |
| JP | 2009-512977 A1 | 3/2009 |
| JP | 2011-134926 A1 | 7/2011 |
| JP | 2011-181888 A1 | 9/2011 |
| JP | 2011-205142 A1 | 10/2011 |
| JP | 2012-084855 A1 | 4/2012 |
| JP | 2013-254990 A1 | 12/2013 |
| JP | 5533183 B2 | 6/2014 |
| WO | 2005/099310 A2 | 10/2005 |
| WO | 2007/149362 A2 | 12/2007 |
| WO | 2008/051596 A2 | 5/2008 |
| WO | 2014/156159 A1 | 10/2014 |
| WO | 2014/157455 A1 | 10/2014 |
| WO | 2015/068344 A1 | 5/2015 |
| WO | 2015/083364 A1 | 6/2015 |
| WO | 2015/083365 A1 | 6/2015 |
| WO | 2015/083366 A1 | 6/2015 |

OTHER PUBLICATIONS

U.S. Appl. No. 15/078,321, filed Mar. 23, 2016, Maki, Keiichi.
U.S. Appl. No. 15/077,143, filed Mar. 22, 2016, Maki, Keiichi.
U.S. Appl. No. 15/078,404, filed Mar. 23, 2016, Maki, Keiichi.
International Search Report and Written Opinion (Application No. PCT/JP2015/004815) dated Dec. 1, 2015.

* cited by examiner

LIGHT EMITTING MODULE

CROSS-REFERENCE TO RELATED APPLICATION

This application is a continuation of U.S. application Ser. No. 15/269,021 filed Sep. 19, 2016, which is a continuation of prior International Application No. PCT/JP2015/004815 filed on Sep. 18, 2015, which is based upon and claims the benefit of priority from Japanese Patent Application No. 2014-196381 filed on Sep. 26, 2014, the entire contents of which are incorporated herein by reference.

FIELD

Embodiments of the present disclosure relate to a light emitting module.

BACKGROUND

In recent years, efforts for decreasing an energy consumption amount are emphasized. In view of such a background, Light Emitting Diodes (LEDs) that have a relatively little power consumption are getting attention as a next-generation light source. LEDs are compact, have a little amount of heat generation, and have an excellent responsiveness. Hence, LEDs are widely applied in various optical devices. For example, in recent years, a module that has a right source which is LEDs arranged on a flexible and light transmissive substrate has been proposed.

Lights from LEDs are monochromatic color lights, such as Red (R), Green (G), and Blue (B). Hence, in order to accomplish a white light and an intermediate-color light using a light source that includes LEDs, it is necessary to arrange multiple LEDs that emit different color lights adjacent to each other. However, wiring to the flexible and light transmissive substrate without a reduction of the light transmissivity thereof is difficult.

DETAILED DESCRIPTION

A light emitting module according to the present disclosure includes a first insulation film with a light transmissivity, a second insulation film disposed so as to face the first insulation film, a plurality of first double-sided light emitting elements disposed between the first insulation film and the second insulation film, and each including a pair of electrodes on one surface, a plurality of second double-sided light emitting elements disposed between the first insulation film and the second insulation film adjacent to the respective first double-sided light emitting elements, each including a pair of electrodes on one surface, and emitting different light from the first double-sided light emitting element, a first conductor pattern formed on a surface of the first insulation film, and connecting the plurality of first double-sided light emitting elements in series, a second conductor pattern formed on a surface of the first insulation film, and connecting the plurality of second double-sided light emitting elements in series, and a connection between the first conductor pattern and the second conductor pattern.

First Embodiment

A first embodiment of the present disclosure will be explained with reference to the figures. As for the explanation, an XYZ coordinate system that has the X axis, the Y axis and the Z axis orthogonal to one another is adopted.

Figure 1:
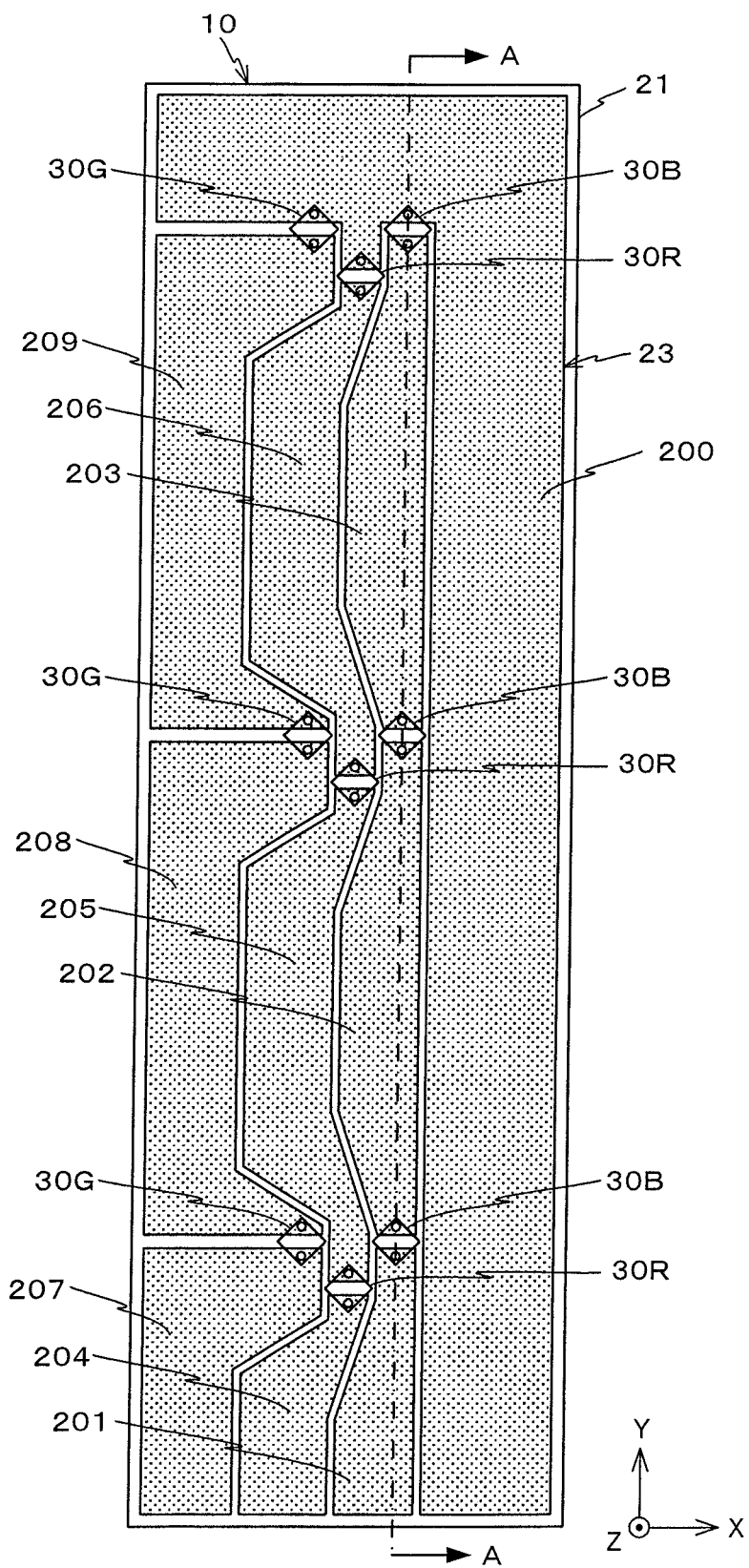
FIG. 1 is a plan view illustrating a light emitting module according to a first embodiment.

FIG. 1 is a plan view of the light emitting module 10 according to this embodiment. As illustrated in FIG. 1, a light emitting module 10 is a module that has the lengthwise direction which is in the Y-axis direction. This light emitting module 10 has a light source that includes light emitting elements 30R, 30G, and 30B of three colors arranged adjacent to each other.

Figure 2:
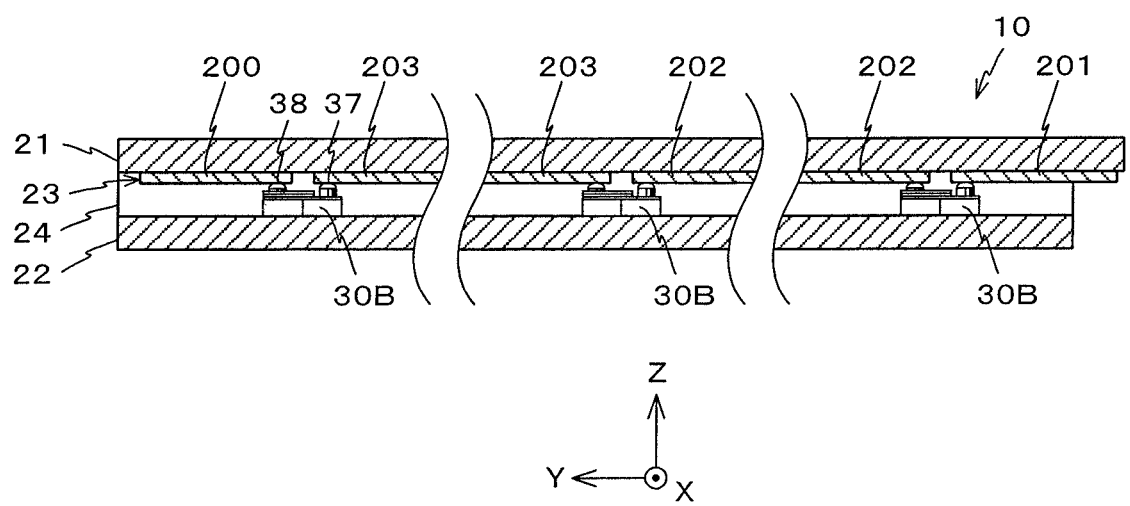
FIG. 2 is a diagram illustrating a cross-section of the light emitting module.

FIG. 2 is a diagram illustrating a cross-section of the light emitting module 10 in FIG. 1 taken along a line A-A. As is clear from FIG. 2, the light emitting module 10 includes a pair of light transmissive films 21, 22, a resin layer 24 formed between the light transmissive films 21, 22, and the light emitting elements 30R, 30G, and 30B arranged in the resin layer 24. Note that FIG. 2 illustrates only the light emitting elements 30B.

The light transmissive films 21, 22 are each a rectangular film that has the lengthwise direction which is in the Y-axis direction. The light transmissive films 21, 22 each have a thickness of substantially 50-300 μm, and have a transmissivity for visible light. It is preferable that the total light beam transmissivity of the light transmissive film 21 should be substantially 5-95%. Note that the term total light beam transmissivity means a total light beam transmissivity measured in compliance with Japanese Industrial Standards JISK7375:2008.

The light transmissive films 21, 22 are flexible, and the bending elastic modulus is substantially 0-320 kgf/mm$^2$. Note that the bending elastic modulus is a value measured by a method in compliance with ISO178 (JIS K7171:2008).

Example materials of the light transmissive films 21, 22 are polyethylene-terephthalate (PET), polyethylene-naphthalate (PEN), polycarbonate (PC), polyethylene-succinate (PES), arton (ARTON), and an acrylic resin.

In the pair of light transmissive films 21, 22, a conductor layer 23 that has a thickness of substantially 0.05-10 µm is formed on the lower surface of the light transmissive film 21 (the surface at the −Z side in FIG. 2). For example, the conductor layer 23 is a deposited film or a sputtered film. The conductor layer 23 may be a pasted metal film by an adhesive. When the conductor layer 23 is a deposited film or a sputtered film, the conductor layer 23 has a thickness of substantially 0.05-2 µm. When the conductor layer 23 is a pasted metal film, the conductor layer 23 has a thickness of substantially 2-10 µm or 2-7 µm.

As illustrated in FIG. 1, the conductor layer 23 includes an L-shaped mesh pattern 200 formed along the outer edge of the light transmissive film 21 at the +X side, mesh patterns 201, 202, 203 arranged along the outer edge of the mesh pattern 200 at the −X side, mesh patterns 204, 205, 206 disposed at the respective −X sides of the mesh patterns 201-203, and mesh patterns 207, 208, 209 disposed at the respective −X sides of the mesh patterns 204-206. The mesh patterns 200-209 are each formed of a metal, such as copper (Cu) or gold (Au).

The mesh patterns 201, 204, and 207 have respective +Y-side ends connected to the light emitting elements 30B, 30R, and 30G, respectively. Those mesh patterns 201, 204 and 207 are shaped so as to decrease the width from the −Y-side end toward the +Y-side end.

The mesh patterns 202, 203 have the respective +Y-side ends and the respective −Y-side ends connected to the light emitting elements 30B. The mesh patterns 205, 206 have the respective +Y-side ends and the respective −Y-side ends connected to the light emitting elements 30R. The mesh patterns 208, 209 have the respective +Y-side ends and the respective −Y-side ends connected to the light emitting elements 30G. Those mesh patterns 202, 203, 205, 206, 208, and 209 are shaped so as to decrease the width from the center toward both ends in the Y-axis direction.

Figure 3:
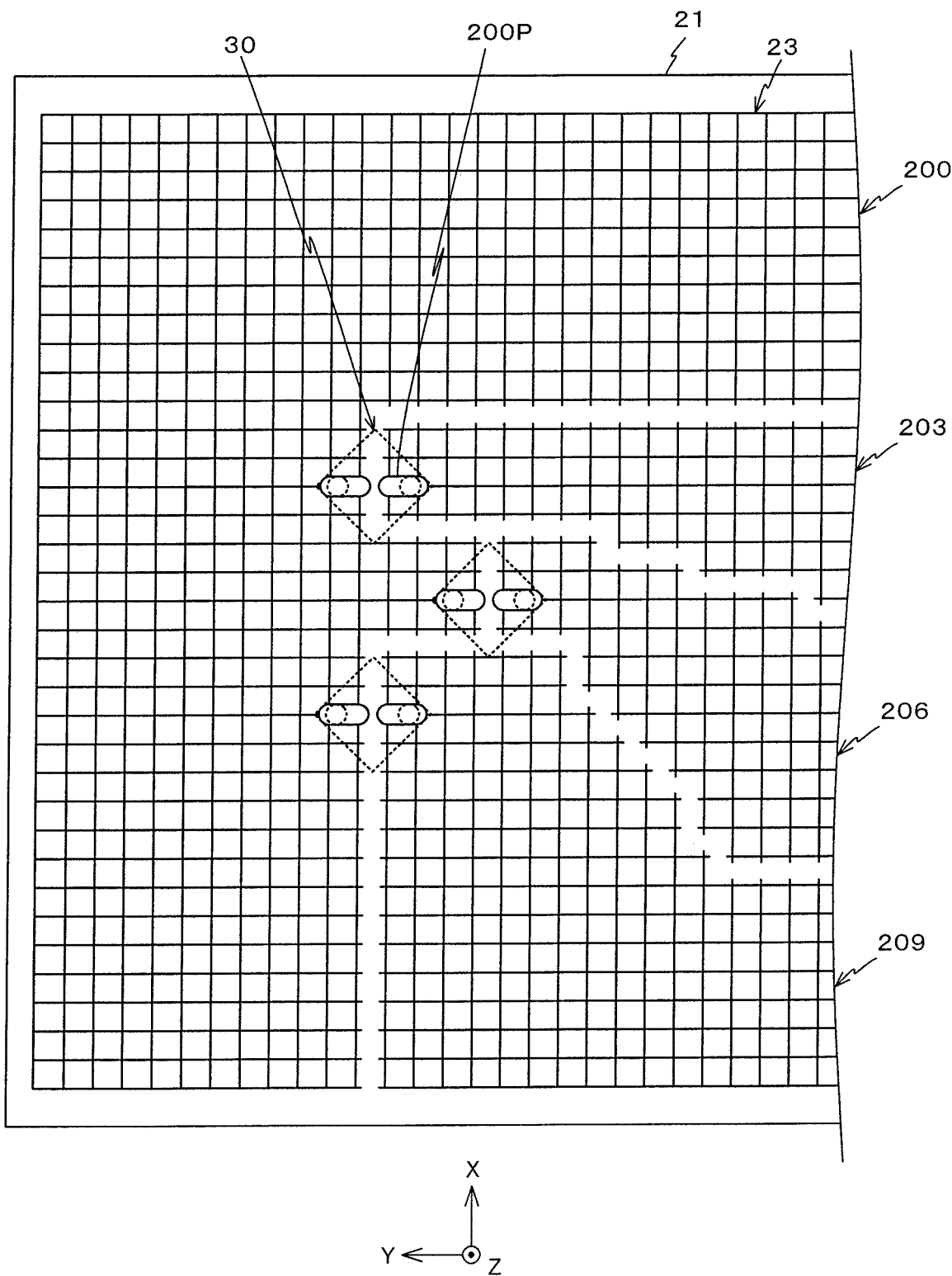
FIG. 3 is a diagram illustrating apart of a mesh pattern forming a conductor layer in an enlarged manner.

FIG. 3 is a diagram illustrating the mesh patterns 200, 203, 206, 209 in a partially enlarged manner. As illustrated in FIG. 3, the mesh patterns 200-209 are each line patterns that have a line width of substantially 10 µm. The line patterns in parallel with the X-axis direction are formed at the pitch of substantially 300 µm along the Y-axis direction. In addition, the line patterns in parallel with the Y-axis direction are formed at the pitch of substantially 300 µm along the X-axis direction. Each mesh pattern 200-209 is formed with a connection pad 200P connected to the electrode of the light emitting element 30R, 30G, and 30B.

As illustrated in FIG. 2, the light emitting module 10 has the light transmissive film 22 that is shorter than the light transmissive film 21 in the Y-axis direction. Hence, the respective −Y-side ends of the mesh patterns 200, 201, 204, and 207 that form the conductor layer 23 are exposed.

The resin layer 24 is formed between the light transmissive films 21, 22. The resin layer 24 has a transmissivity to visible light.

Each of the light emitting elements 30R, 30G, and 30B is a square LED chip that has a side of substantially 0.1-3 mm. In order to simplify the explanation, the light emitting elements 30R, 30B, and 30G are collectively referred to as a light emitting element 30 as appropriate below. In this embodiment, the light emitting elements 30R, 30G, and 30B are each a bare chip.

Figure 4:
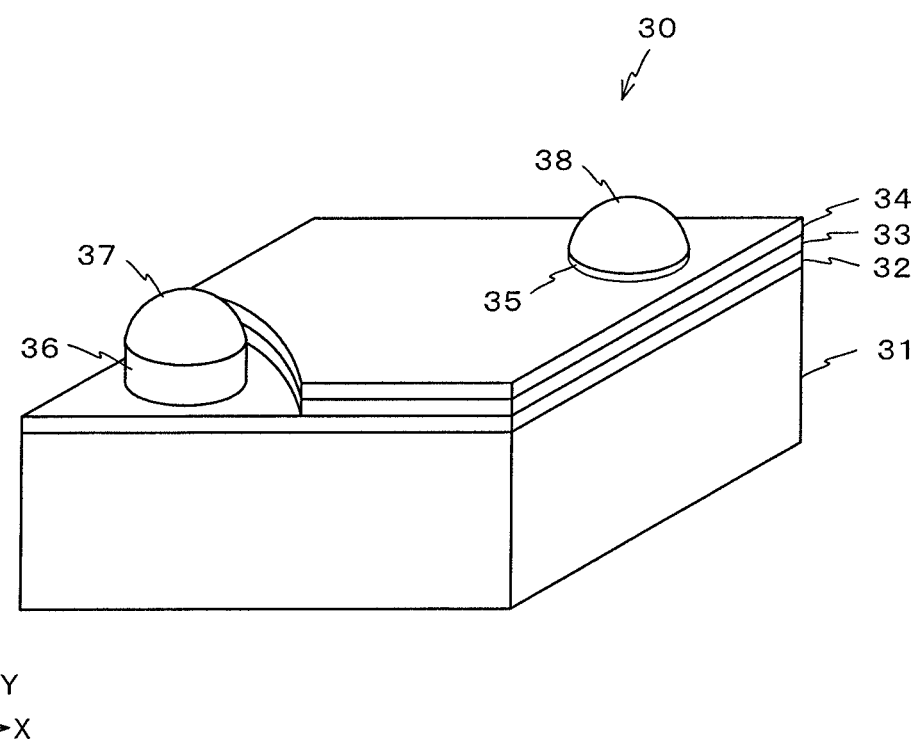
FIG. 4 is a perspective view illustrating a light emitting element.

As illustrated in FIG. 4, the light emitting element 30 is a four-layer-structure LED chip that includes a base substrate 31, an N-type semiconductor layer 32, an active layer 33, and a P-type semiconductor layer 34. The rated voltage of the light emitting element 30 is substantially 2.5 V.

The base substrate 31 is, for example, a square tabular substrate formed of sapphire. The N-type semiconductor layer 32 in the same shape as that of the base substrate 31 is formed on the upper surface of the base substrate 31. In addition, the active layer 33, the P-type semiconductor layer 34 are laminated in sequence on the upper surface of the N-type semiconductor layer 32. The N-type semiconductor layer 32, the active layer 33, and the P-type semiconductor layer 34 are each formed of a compound semiconductor material. For example, in the case of the light emitting element that emits red light, an InAlGaP-based material is applicable as the active layer. In addition, in the cases of the light emitting elements that emit blue and green lights, a GaN-based semiconductor material is applicable to the P and N type semiconductor layers 34, 32 and an InGaN-based semiconductor material is applicable to the active layer 33, respectively. In any cases, the active layer may employ a Double-Hetero (DH) junction structure, or a Multi-Quantum Well (MQW) structure. In addition, a PN junction structure is also applicable.

The active layer 33, and the P-type semiconductor layer 34 laminated on the N-type semiconductor layer 32 have respective notches formed at the corner portions at the −Y side and also the −X side. The surface of the N-type semiconductor layer 32 is exposed via the notches of the active layer 33 and the P-type semiconductor layer 34.

The region of the N-type semiconductor layer 32 exposed from the active layer 33 and the P-type semiconductor layer 34 is formed with a pad 36 electrically connected to the N-type semiconductor layer 32. In addition, a pad 35 that is electrically connected to the P-type semiconductor layer 34 is formed at the corner portion of the P-type semiconductor layer 34 at the +X side and also the +Y side. The pads 35, 36 are formed of copper (Cu) or gold (Au), and bumps 37, 38 are formed on the respective upper surfaces. The bumps 37, 38 are each a metal bump formed of gold (Au) or a gold alloy. A solder bump formed in a semi-spherical shape may be applied instead of the metal bump. In the light emitting element 30, the bump 37 serves as a cathode electrode, while the bump 38 serves as an anode electrode.

In this embodiment, the light emitting element 30R emits red light. In addition, the light emitting element 30G emits green light, and the light emitting element 30B emits blue light. More specifically, the light emitting element 30R emits light that has a peak wavelength of 600-700 nm or so. In addition, the light emitting element 30G emits light that has a peak wavelength of 500-550 nm or so. Still further, the light emitting element 30B emits light that has a peak wavelength of 450-500 nm or so.

The light emitting elements 30R, 30G, and 30B each have the bumps 37, 38 connected to the connection pads 200P formed on the respective mesh patterns 200-209, thus disposed between the two mesh patterns.

As illustrated in FIG. 1, according to the light emitting module 10, the three light emitting elements 30R are disposed between the mesh pattern 204 and the mesh pattern 205, between the mesh pattern 205 and the mesh pattern 206, and between the mesh pattern 206 and the mesh pattern 200, respectively. In addition, the three light emitting elements 30G are disposed between the mesh pattern 207 and the mesh pattern 208, between the mesh pattern 208 and the mesh pattern 209, and between the mesh pattern 209 and the mesh pattern 200, respectively. Still further, the three light emitting elements 30B are disposed between the mesh pattern 201 and the mesh pattern 202, between the mesh pattern 202 and the mesh pattern 203, and between the mesh pattern 203 and the mesh pattern 200, respectively.

Hence, the light emitting elements 30R, the mesh patterns 200, 204-206 are connected in series. Likewise, the light emitting elements 30G, the mesh patterns 200, 207-209 are connected in series, and the light emitting elements 30B, the mesh patterns 200, 201-203 are connected in series. The mesh pattern 200 serves as connection portions for the light emitting elements 30R, 30G, and 30B to the mesh pattern, and applies a common potential to the light emitting elements 30R, 30G, and 30B.

Figure 5:
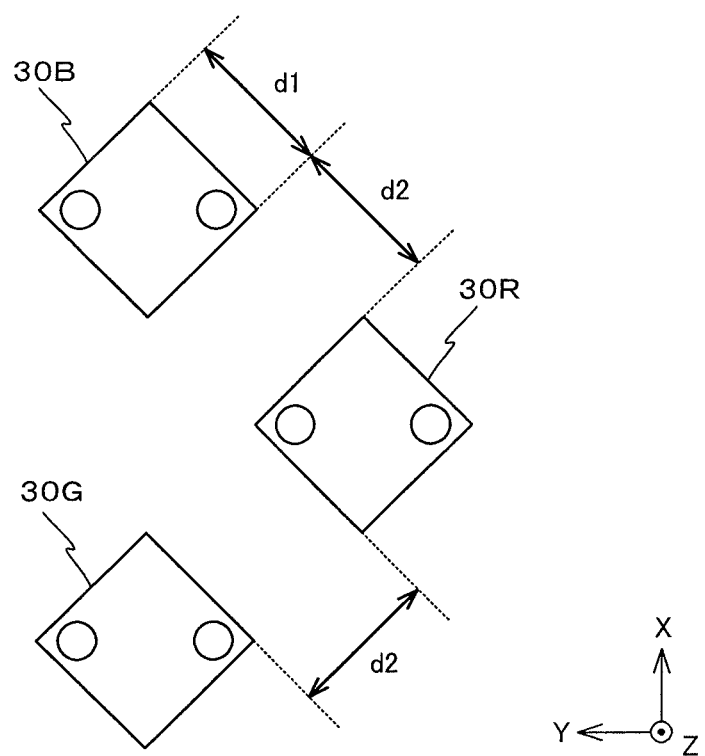
FIG. 5 is a diagram illustrating an arrangement of the light emitting element.

FIG. 5 is a diagram illustrating a positional relationship among the light emitting elements 30R, 30G, and 30B disposed on the mesh patterns 200-209. As illustrated in FIG. 5, each light emitting element 30R, 30G, 30B is arranged adjacent to each other in such a way that a distance d2 to the adjacent light emitting element 30R, 30G, and 30B becomes equal to or shorter than a width d1 of the light emitting element 30R, 30G, and 30B.

When the light emitting elements 30R, 30G, and 30B arranged adjacent to each other have different sizes, the light emitting elements 30R, 30G, and 30B are arranged in such a way that the distance d2 between the adjacent light emitting elements becomes equal to or shorter than the width d1 of the larger light emitting element in the adjacent light emitting elements. Alternatively, the light emitting elements 30R, 30G, and 30B are arranged in such a way that the distance d2 between the adjacent light emitting elements 30R, 30G, and 30B becomes equal to or shorter than the width d1 of the largest light emitting element 30R, 30G, and 30B.

Figure 6:
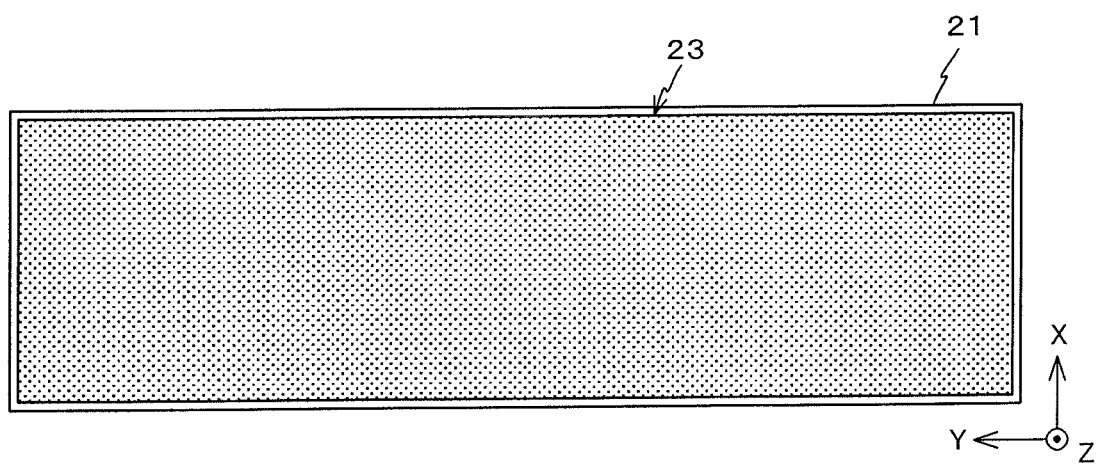
FIG. 6 is a diagram for explaining a manufacturing method of the light emitting module.
Figure 7:
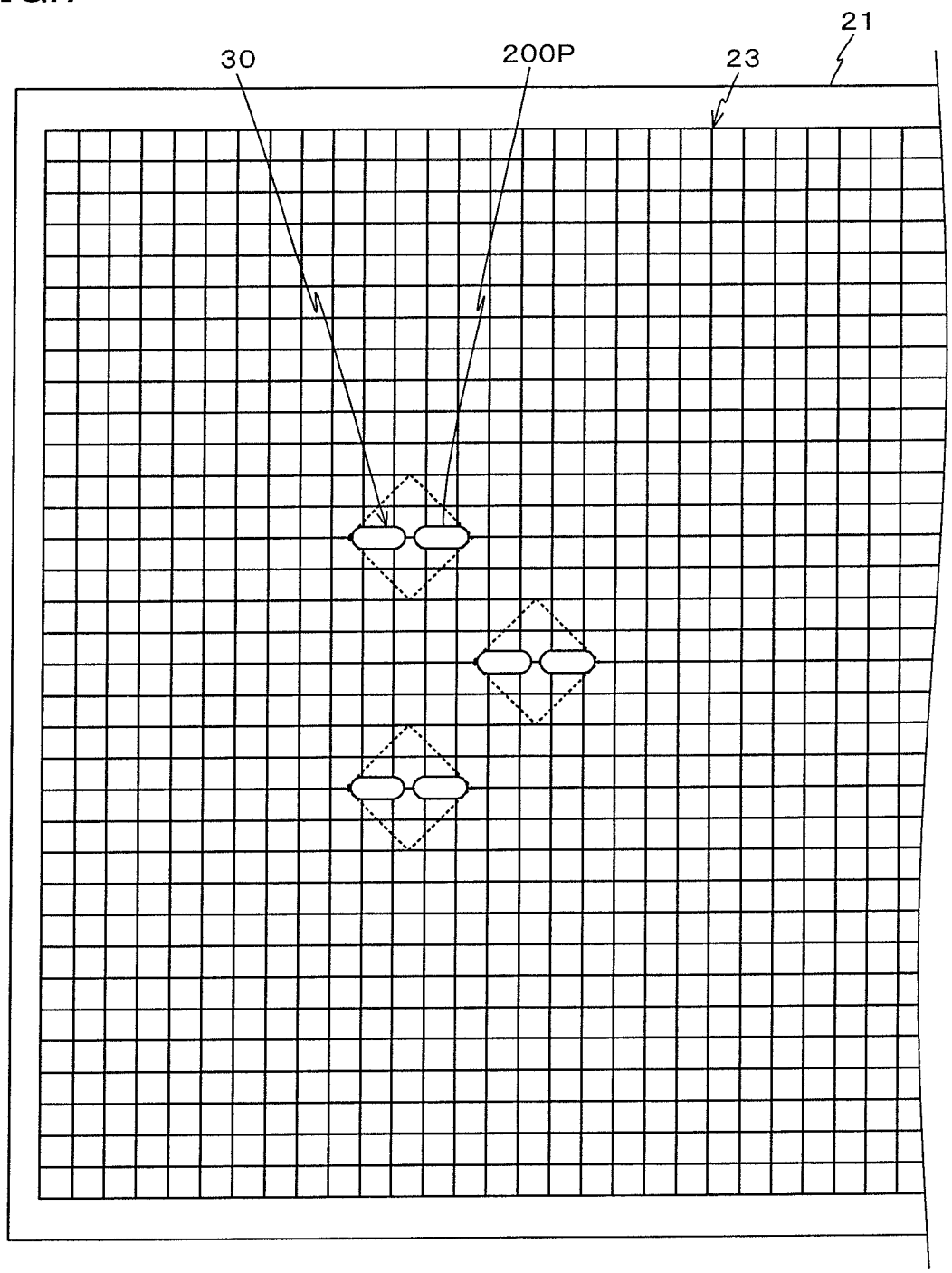
FIG. 7 is a diagram for explaining the manufacturing method of the light emitting module.

Next, a method of manufacturing the above-explained light emitting module 10 will be explained. First, the light transmissive film 21 formed of PET is prepared. Next, as illustrated in FIG. 6, the conductor layer 23 in a mesh shape is formed on the entire surface of the light transmissive film 21 by, for example, a subtract technique or an additive technique. FIG. 7 is a diagram illustrating a part of the conductor layer 23 in an enlarged manner. As illustrated in FIG. 7, in the conductor layer 23 at this stage, portions that will be the mesh patterns 200-209 are formed integrally. In addition, the connection pads 200R are formed on the conductor layer 23 on which the light emitting elements 30R, 30G, and 30B are to be mounted.

Next, this conductor layer 23 is cut by laser to form the mesh patterns 200-209. As for the cutting of the conductor layer 23, laser light is emitted to the conductor layer 23 formed on the surface of the light transmissive film 21. Next, the laser spot of the laser light is moved along dashed lines illustrated in FIG. 8. Hence, the conductor layer 23 is cut along the dashed lines, and as illustrated in FIG. 9, the mesh patterns 200-209 are formed.

Figure 8:
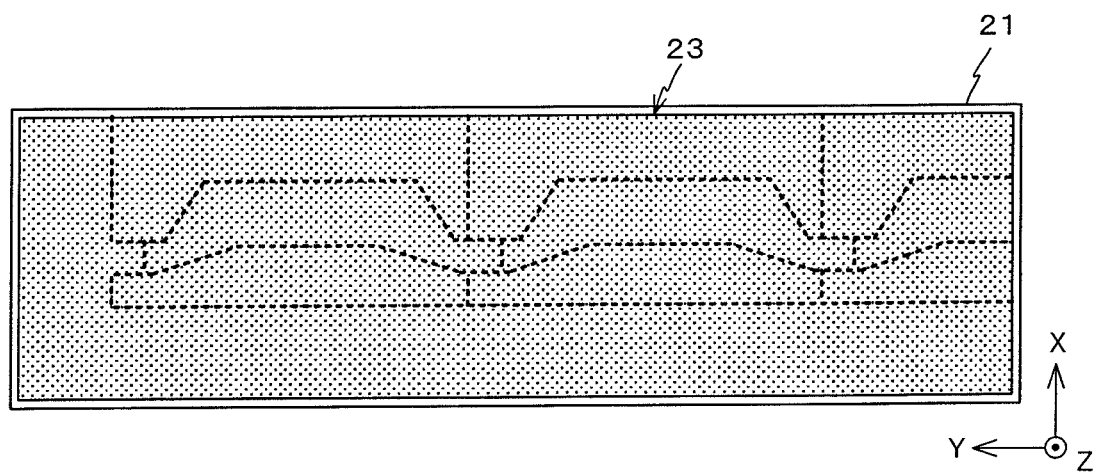
FIG. 8 is a diagram for explaining the manufacturing method of the light emitting module.
Figure 9:
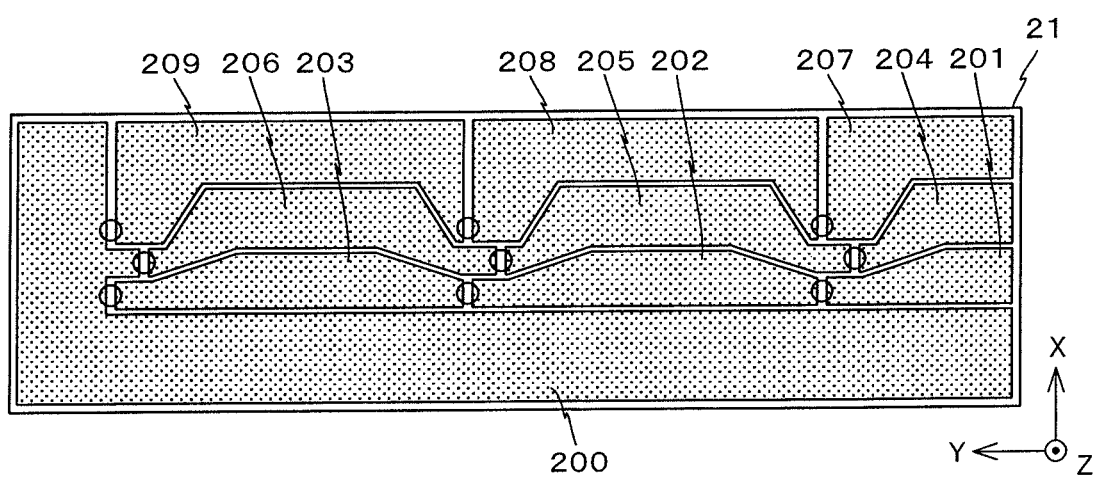
FIG. 9 is a diagram for explaining the manufacturing method of the light emitting module.

When the laser spot of the laser light is moved on the surface of the conductor layer 23 along the dashed lines illustrated in FIG. 8, the portion of the conductor layer 23 located near the moving path of the laser spot is melted and sublimates. Hence, as illustrated in FIG. 3, the mesh patterns 200-209 are cut out, while at the same time, the connection pads 200P formed adjacent to each other are electrically disconnected. According to the light emitting module 10, the pair of connection pads 200P is formed at each portion indicated by a circle in FIG. 9.

Figure 10:
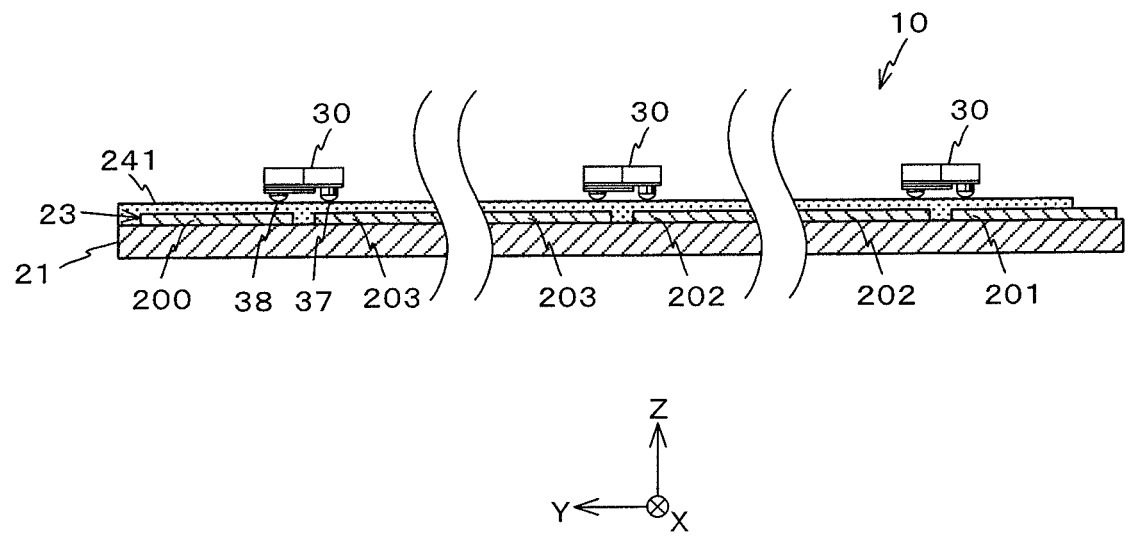
FIG. 10 is a diagram for explaining the manufacturing method of the light emitting module.

Next, as illustrated in FIG. 10, a thermosetting resin 241 is applied to the surface of the light transmissive film 21 on which the mesh patterns 200-209 are formed. This thermosetting resin 241 has the substantially equal thickness to the height of the bumps 37, 38 of the light emitting element 30. According to this embodiment, the thermosetting resin 241 is a resin film, and is disposed on the surface of the light transmissive film 21. An example material of the thermosetting resin 241 is an epoxy-based resin.

Next, the light emitting element 30 is disposed on the thermosetting resin 241. The light emitting element 30 is positioned in such a way that the connection pads 200P formed on the mesh patterns 200-209 are located right below the bumps 37, 38 of the light emitting element 30.

Figure 11:
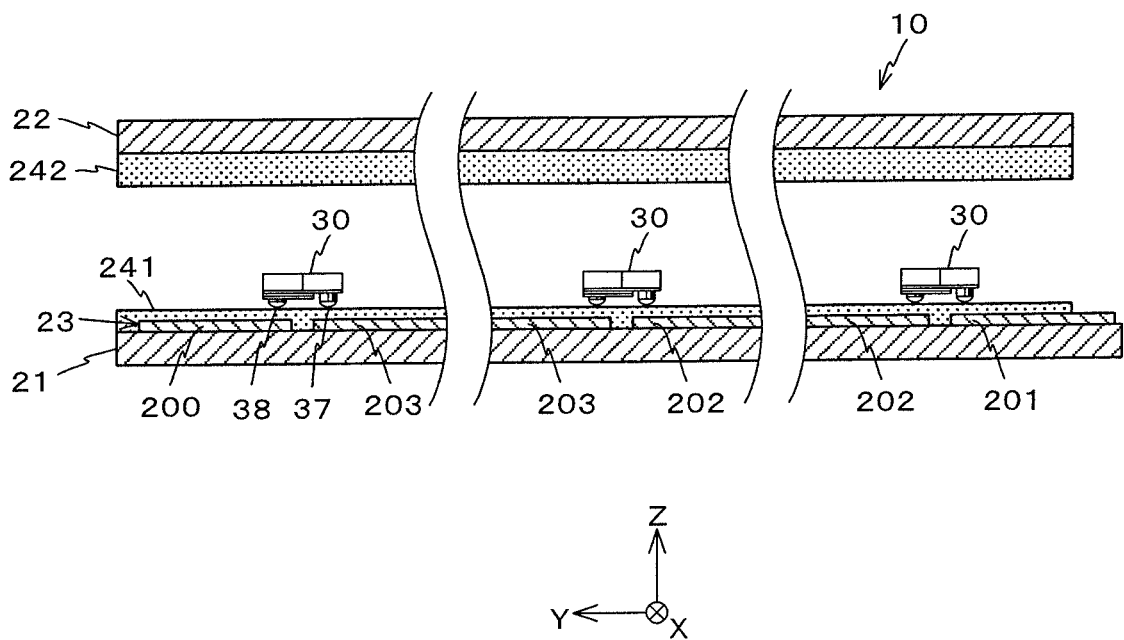
FIG. 11 is a diagram for explaining the manufacturing method of the light emitting module.

Subsequently, as illustrated in FIG. 11, the light transmissive film 22 that has a film formed of a thermoplastic resin 242 pasted on the lower surface is disposed on the upper-surface side of the light transmissive film 21. An example material of the thermoplastic resin 242 is an acrylic elastomer.

Next, the light transmissive films 21, 22 are both heated in a vacuum atmosphere and attached by pressure. Hence, the bumps 37, 38 formed on the light emitting element 30 pass completely through the thermosetting resin 241, and reach the conductor layer 23, and thus electrically connected to each of the mesh patterns 200-209. In addition, the softened thermoplastic resin 242 by heating is filled around the light emitting element 30 without any blank space, while at the same time, the thermosetting resin 241 is cured. Hence, as illustrated in FIG. 2, the thermosetting resin 241 and the thermoplastic resin 242 become the resin layer 24 that holds the light emitting element 30 between the light transmissive films 21, 22. The light emitting module 10 is finished through the processes explained above.

Figure 12:
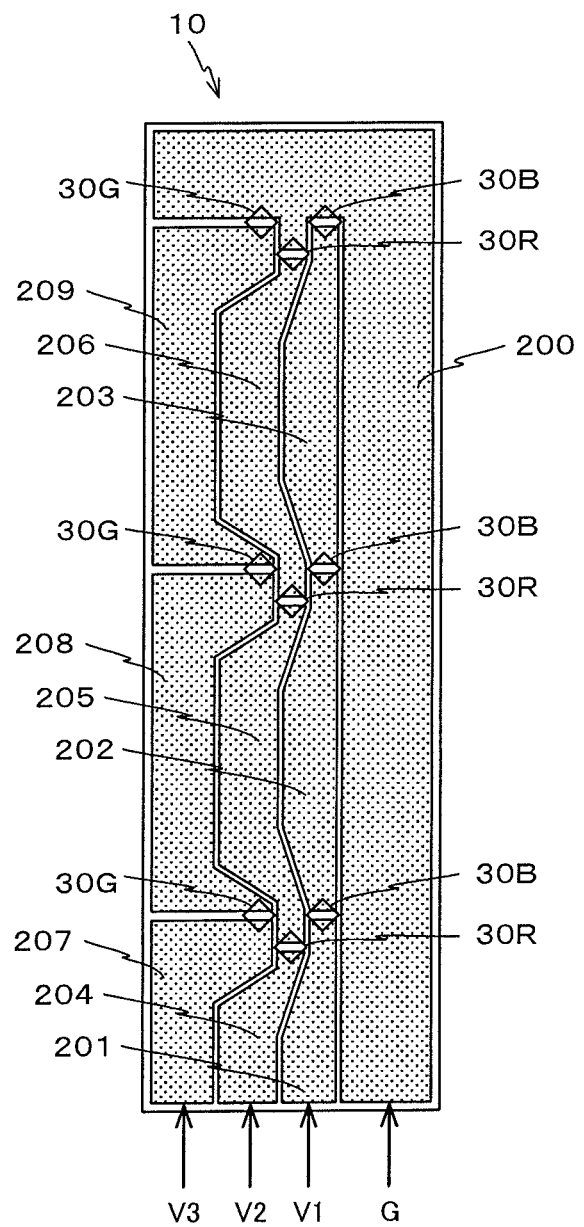
FIG. 12 is a diagram for explaining an operation of the light emitting module.

According to the light emitting module 10 employing the above structure, as illustrated in FIG. 12, with the mesh pattern 200 serving as a ground, voltages V1, V2, V3 are applied to the mesh patterns 201, 204, and 207, respectively. This causes each light emitting module 30R, 30G, and 30B to emit light. As illustrated in FIG. 5, the light emitting elements 30R, 30G, and 30B have the distance d2 which is between the adjacent light emitting elements and which is equal to or shorter than the length d1 of a side of the light emitting element 30. Accordingly, Red (R), Green (G), and Blue (B) lights emitted from the respective light emitting elements 30R, 30G, and 30B are mixed, and are visible for a human eye as if the light emitting module 10 is emitting white light.

Depending on the color mixing level, when the light from the light emitting module 10 is reddish or bluish, by adjusting the respective values of the voltages V1-V3, the color of light emitted from the light emitting module 10 is adjustable. In addition, by changing the respective voltages V1-V3 so as to adjust the respective intensities of Red (R), Green (G), and Blue (B) lights emitted from the light emitting modules 30R, 30G, and 30B, the light emitting module 10 is capable of emitting light with an intermediate color other than white. In this case, the intermediate color means the elementary color of Red (R), Green (G), and Blue (B) and the intermediate color thereof.

According to this embodiment, the light emitting element 30G that emits green light, and the light emitting element 30B that emits blue light are arranged adjacent to the light emitting element 30R that emits red light. In general, a human eye has a high sensitivity to red light. Hence, by arranging the light emitting elements 30G, 30B around the light emitting element 30R that emits red light, a person is capable of feeling as if the emitted light from the light emitting module 10 is uniform.

As explained above, according to this embodiment, the respective ends of the mesh patterns 201-209 are connected to the light emitting elements 30. In addition, the mesh patterns 201-209 are shaped so as to reduce the width toward the respective ends to which the light emitting elements 30 are connected. This decreases a difference in resistance value among the mesh patterns 202, 203 that connect the three light emitting elements 30B in series, the mesh patterns 205, 206 that connect the three light emitting elements 30R in series, and the mesh patterns 208, 209 that connect the three light emitting elements 30G in series. In addition, a difference in resistance value among the mesh pattern 201 connected to the light emitting element 30B, the mesh pattern 204 connected to the light emitting element 30R, and the mesh pattern 207 connected to the light emitting element 30G is decreased.

Hence, the conductor layer 23 that supplies power to the light emitting elements 30 can be made thin. Consequently, the wiring for the light emitting element 30 can be formed without deteriorating the light transmissivity of the light emitting module 10 and the flexibility thereof.

According to this embodiment, the light emitting element 30R that emits red light, the light emitting element 30G that emits green light, and the light emitting element 30B that emits blue light are arranged adjacent to each other. Hence, the Red (R), Green (G), and Blue (B) lights emitted from the respective light emitting elements 30R, 30G, and 30B are mixed, enabling the light emitting module 10 to emit white and intermediate-color lights.

According to this embodiment, the three light emitting elements 30R are connected in series. Hence, the current flowing through each light emitting element 30R is uniform. This makes the light emitting intensity of each of the three light emitting elements 30R substantially uniform. Likewise, the three light emitting elements 30G and the three light emitting elements 30B are also connected in series, respectively. This makes the light emitting intensity of each of the three light emitting elements 30G substantially uniform, and the light emitting intensity of each of the three light emitting elements 30B substantially uniform. Hence, the light emitting elements 30 of the light emitting module 10 are facilitated to emit light at a uniform intensity.

According to this embodiment, as illustrated in FIG. 2, the respective light emitting elements 30R, 30G, and 30B are arranged between the pair of light transmissive films 21, 22. Hence, the light emitting module 10 can be made thin in comparison with a case in which the light emitting elements 30R, 30G, and 30B are arranged so as to be laid over in the normal line direction of the light transmissive films 21, 22.

According to this embodiment, the light emitting elements 30 are connected by the mesh patterns 201-209. Those mesh patterns 200-209 are each formed by a metal thin film that has a line width of substantially 10 μm. Accordingly, the sufficient light transmissivity of the light emitting module 10 and also the sufficient flexibility thereof are ensured.

According to this embodiment, the conductor layer 23 that includes the mesh patterns 200-209 is formed on the upper surface of the light transmissive film 21 in the pair of light transmissive films 21, 22. Hence, the light emitting module 10 according to this embodiment is made thinner than light emitting modules that have the conductor layers on both the upper surface of the light emitting element 30 and the lower surface thereof. Consequently, the flexibility of the light emitting module 10 and the light transmissivity thereof are improved.

According to this embodiment, the conductor layer 23 formed with the connection pads 200P is divided finely by laser light to form the mesh patterns 200-209. However, the mesh patterns 200-209 illustrated in FIG. 3 may be formed by photo-lithography.

In the above embodiment, the explanation has been given of an example case in which the resin layer 24 is formed of the thermosetting resin 241 and the thermoplastic resin 242 both in a sheet shape. However, the thermosetting resin 241 and the thermoplastic resin 242 may be applied to the light transmissive films 21, 22, and the resin layer 24 may be formed by those applied thermosetting resin 241 and thermoplastic resin 242.

In the above embodiment, the explanation has been given of an example case in which the resin layer 24 is formed of the thermosetting resin 241 and the thermoplastic resin 242. However, the resin layer 24 may be formed of a thermoplastic resin only. In addition, the resin layer 24 may be formed of a thermosetting resin only.

In the above embodiment, the explanation has been given of an example case in which the conductor layer 23 that includes the mesh patterns 200-209 is formed of a metal, such as copper (Cu) or silver (Ag). However, the conductor layer 23 may be formed of a transparent material with a conductivity like Indium Tin Oxide (ITO). In this case, the mesh patterns 200-209 illustrated in FIG. 1 is formed of a plane pattern (solid pattern) formed of a transparent conductive film with a uniform thickness.

Figure 13:
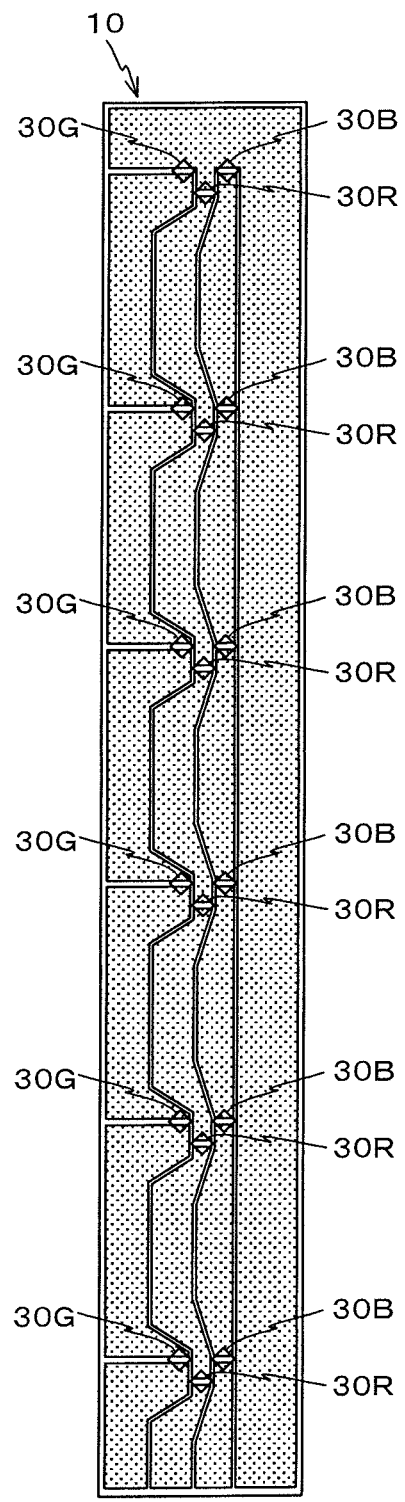
FIG. 13 is a diagram illustrating a modified example of the light emitting module.

In the above embodiment, as illustrated in FIG. 1, the explanation has been given of an example case in which the light emitting module 10 includes three groups each including the three light emitting elements 30R, 30G, and 30B arranged adjacent to each other. However, as illustrated in FIG. 13 as an example, the group including the three light emitting elements 30R, 30G, and 30B may be formed by equal to or greater than four.

Figure 14:
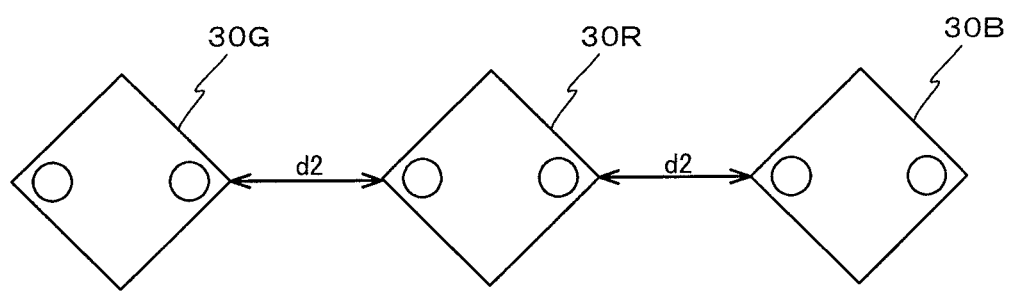
FIG. 14 is a diagram for explaining a modified example of the light emitting module.
Figure 15:
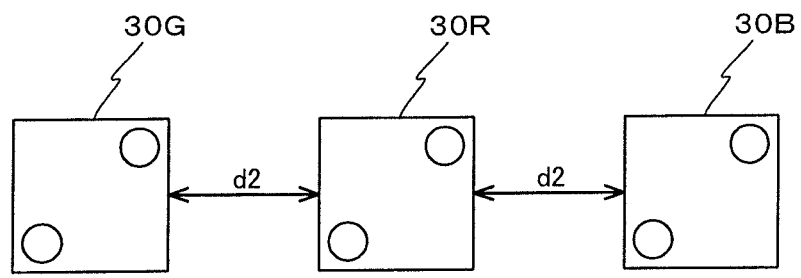
FIG. 15 is a diagram for explaining a modified example of the light emitting module.

In the above embodiment, as illustrated in FIG. 5, the explanation has been given of an example case in which the three light emitting elements 30R, 30G, and 30B are arranged in an L shape. However, as illustrated in FIG. 14 or 15 as an example, the three light emitting elements 30R, 30G, and 30B may be arranged linearly.

Figure 16:
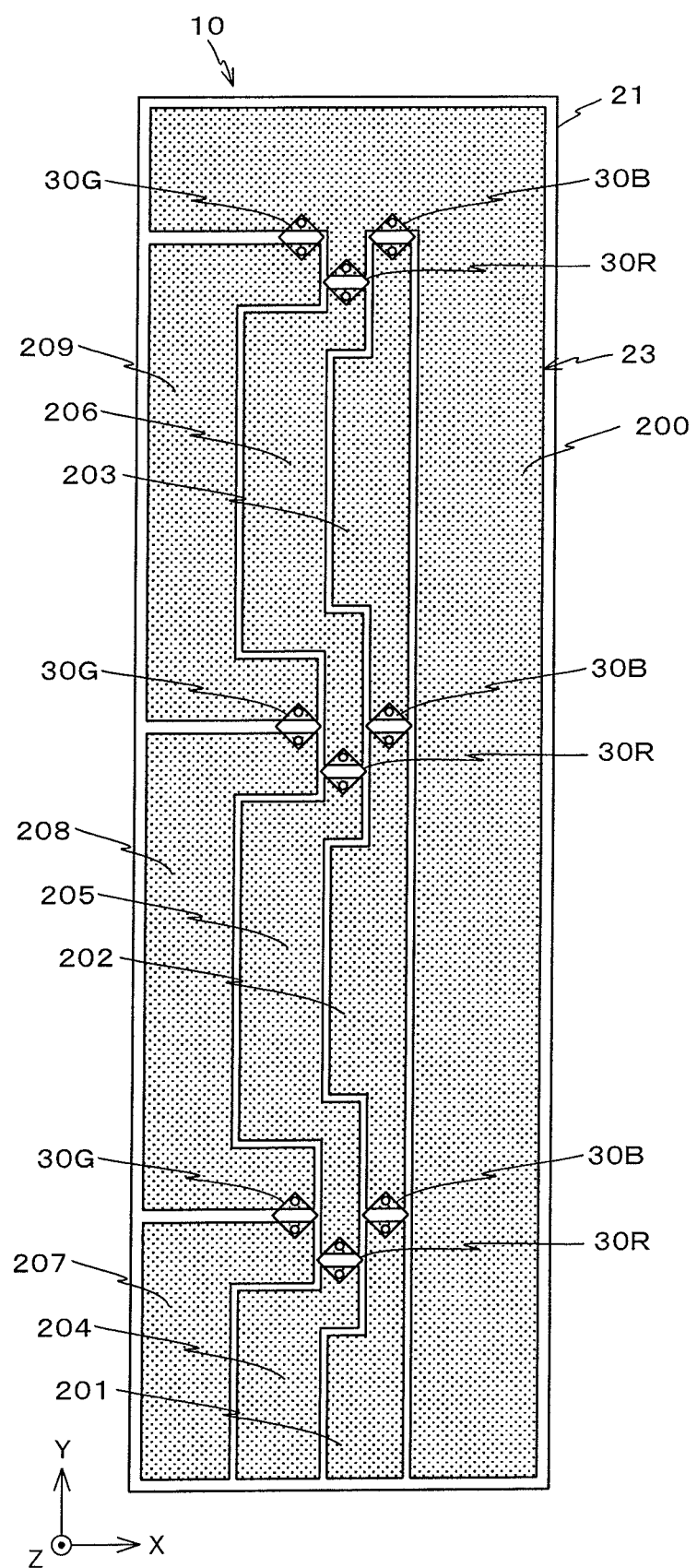
FIG. 16 is a diagram illustrating a modified example of the light emitting module.

In the above embodiment, the explanation has been given of an example case in which the mesh patterns 201-209 are shaped so as to gradually decrease the width toward the light emitting elements 30. However, as illustrated in FIG. 16, it is appropriate if the width of the respective ends of the mesh patterns 201-209 are narrower than that of the respective centers.

In the above embodiment, the explanation has been given of an example case in which the light emitting elements 30G, 30B are arranged adjacent to the light emitting element 30R. However, the arrangement sequence of the light emitting elements 30 is not limited to this case. For example, other light emitting elements 30 may be arranged adjacent to the light emitting element 30G or 30B.

Second Embodiment

Next, an explanation will be given of a second embodiment of the present disclosure. A light emitting module 10A according to the second embodiment differs from the light emitting module 10 of the first embodiment that the respective light emitting elements 30 are connected in parallel. An explanation will be given of the light emitting module 10A according to the second embodiment. The explanation for the common structure as that of the first embodiment will be omitted.

Figure 17:
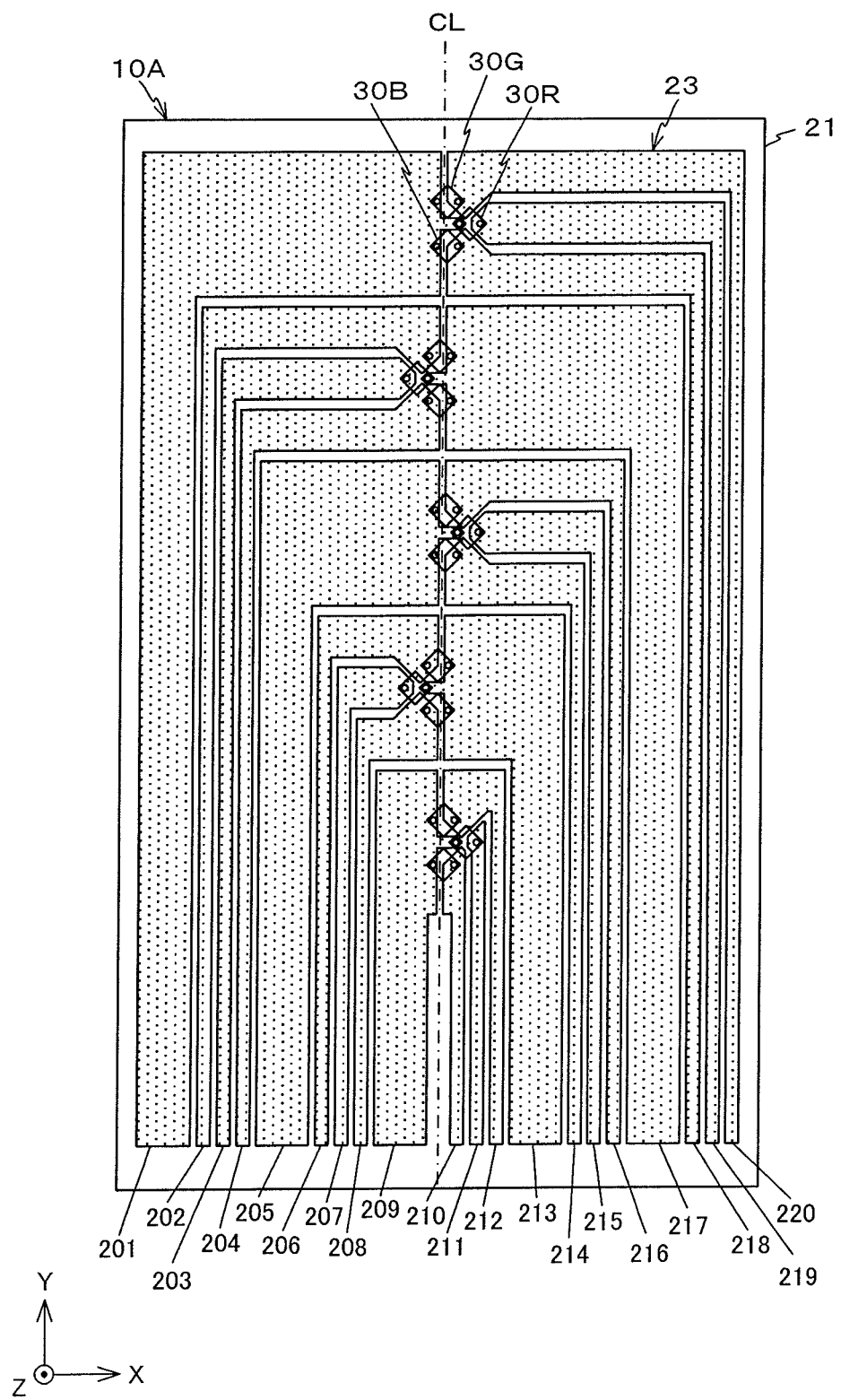
FIG. 17 is a plan view illustrating the light emitting module according to a second embodiment.

FIG. 17 is a plan view of the light emitting module 10A according to this embodiment. As illustrated in FIG. 17, the light emitting module 10A is a module that has the lengthwise direction which is in the Y-axis direction. For example, the light emitting module 10A includes respective five light emitting elements 30R, 30G, and 30B. As illustrated in FIG. 5, each light emitting element 30R, 30G, 30B is arranged adjacent to each other in such a way that the distance d2 to the adjacent light emitting element 30R, 30G, and 30B becomes equal to or shorter than the width d1 of the light emitting element 30R, 30G, and 30B.

According to the light emitting module 10A, five groups each including the three light emitting elements 30R, 30G, and 30B are formed. Lights from the light emitting elements 30R, 30G, and 30B forming each group are mixed, and thus a human eye recognizes each group including the three light emitting elements 30R, 30G, and 30B as a dot light source.

The conductor layer 23 of the light emitting module 10 includes a plurality of mesh patterns 201-220. Each mesh pattern 201-220 is formed of a metal, such as copper (Cu) or silver (Ag).

Each of the mesh patterns 201-220 is formed in an L shape. At the left side (−X side) of the light transmissive film 21, the mesh pattern 201 is disposed along the outer edge of the light transmissive film 21 at the −X side, and the mesh patterns 202-209 are disposed in sequence toward the internal side from the mesh pattern 201. In addition, at the right side (+X side) of the light transmissive film 21, the mesh pattern 220 is disposed along the outer edge of the light transmissive film 21 at the +X side, and the mesh patterns 219-210 are disposed in sequence toward the internal side from the mesh pattern 220.

According to the light emitting module 10A, the mesh pattern 201 faces the mesh patterns 218-220 across a center line CL which passes through the center of the light transmissive film 21, and which is in parallel with the Y-axis direction. Likewise, the mesh patterns 202-204 face the mesh pattern 217, the mesh pattern 205 faces the mesh patterns 214-216, the mesh patterns 206-208 face the mesh pattern 213, and the mesh pattern 209 faces the mesh patterns 210-212.

As illustrated in FIG. 17, the five light emitting elements 30R are arranged across respective pairs of mesh patterns 201, 219, mesh patterns 203, 217, mesh patterns 205, 215, mesh patterns 207, 213, and mesh patterns 209, 211. The five light emitting elements 30G are arranged across the respective pair of mesh patterns 201, 220, mesh patterns 202, 217, mesh patterns 205, 216, mesh patterns 206, 213, and mesh patterns 209, 212. The five light emitting elements 30B are arranged across the respective pairs of mesh patterns 201, 218, mesh patterns 204, 217, mesh patterns 205, 214, mesh patterns 208, 213, and mesh patterns 209, 210.

Hence, the respective light emitting elements 30R, 30G, and 30B of the light emitting module 10A are connected in parallel relative to a power supply. This enables an individual control to the light emitting element 30R, 30G, and 30B. The mesh patterns 201, 205, 209, 213, 217 serve as connection portions of the light emitting elements 30R, 30G, and 30B for the mesh patterns in each group, and thus a common potential is applied to the light emitting elements 30R, 30G, and 30B in each group.

As explained above, according to the light emitting module 10A of this embodiment, the respective light emitting elements 30R, 30G, and 30B are connected in parallel relative to a power supply and a control circuit. Hence, respective voltages to be applied to the light emitting elements 30R, 30G, and 30B are controllable, enabling an individual control of the light emitting element 30R, 30G, and 30B.

Figure 18:
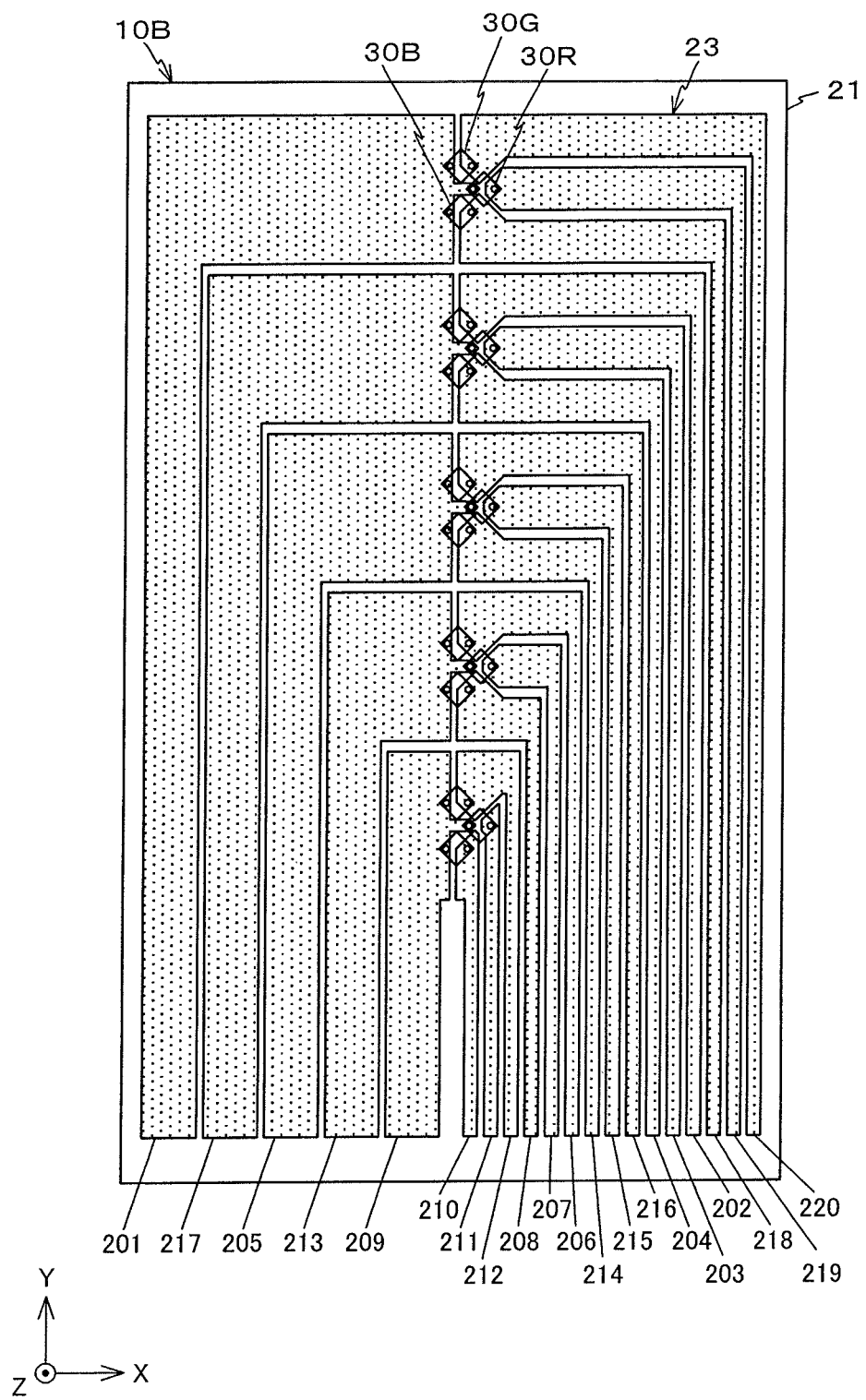
FIG. 18 is a plan view illustrating the light emitting module according to a modified example.

The layout of the mesh patterns 201-220 of the light emitting module 10A in the above embodiments is merely an example, and the present disclosure is not limited to this example. For example, like a light emitting module 10B illustrated in FIG. 18, the position of the common mesh pattern to the light emitting elements 30R, 30G, and 30B, and the positions of the mesh patterns provided for the respective light emitting elements 30R, 30G, and 30B may be changed as appropriate in accordance with, for example, a wiring circumstance.

Figure 19:
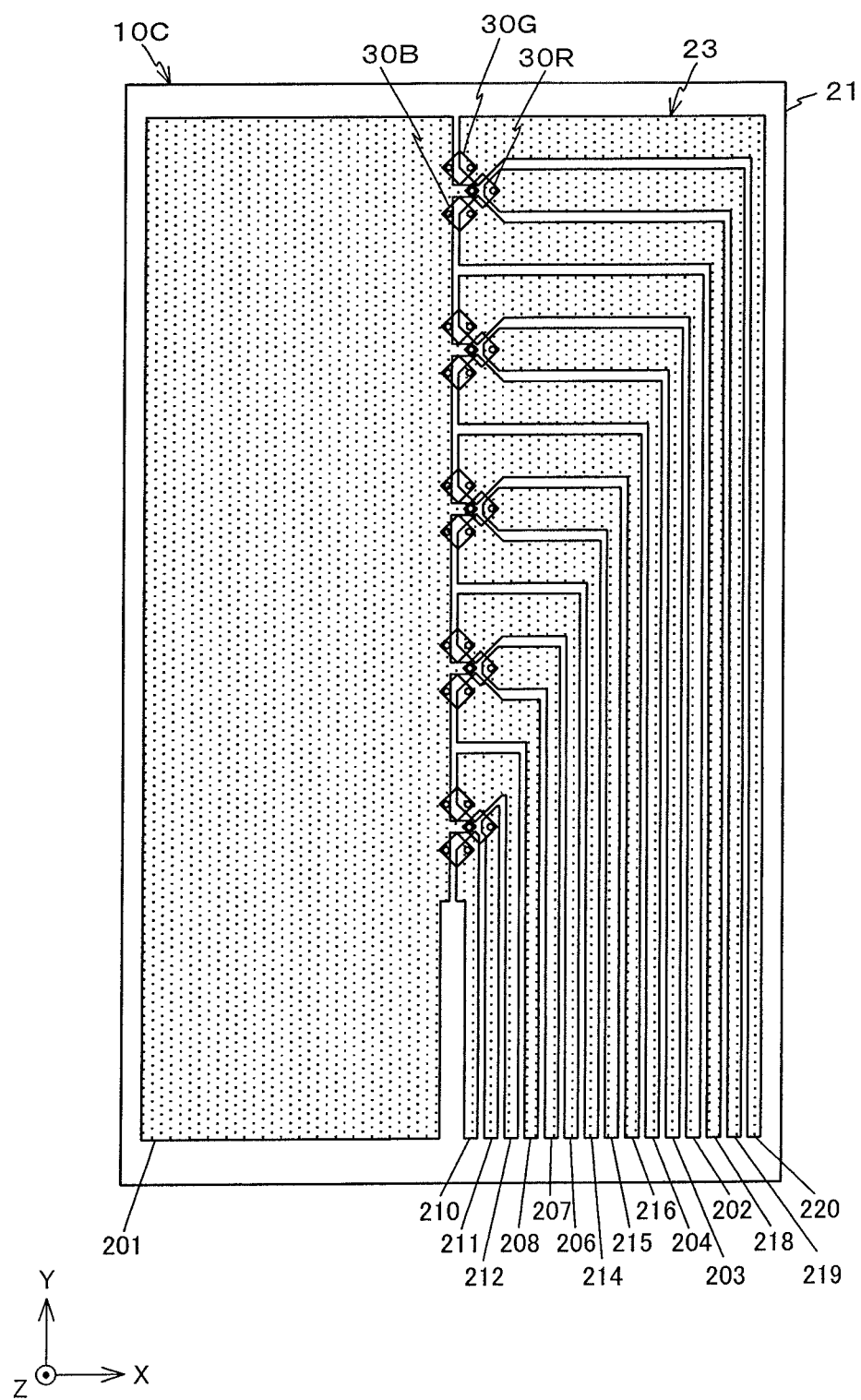
FIG. 19 is a plan view illustrating the light emitting module according to a modified example.

In the above embodiment, the explanation has been given of an example case in which the single mesh pattern is connected to each group including the three light emitting elements 30R, 30G, and 30B. However, like a light emitting module 10C illustrated in FIG. 19, the common mesh pattern to the light emitting elements 30R, 30G, and 30B may be accomplished by a single mesh pattern. In addition, like a light emitting module 10D illustrated in FIG. 20, the conductor layer 23 may include a mesh pattern 221 that is a common pattern connected to all light emitting elements 30R, 30G, and 30B of the light emitting module 10D, mesh patterns 222-224 in a rectangular shape, and mesh patterns 225-230 bent at multiple locations.

In the above first embodiment and second embodiment, the mesh pattern or the transparent conductive film covers the surface of the light transmissive film 21 which is the substrate of the light emitting module 10. In addition, the mesh patterns or the transparent conductive films are electrically separated from each other by a linear region where no mesh pattern or transparent conductive film is present.

Figure 20:
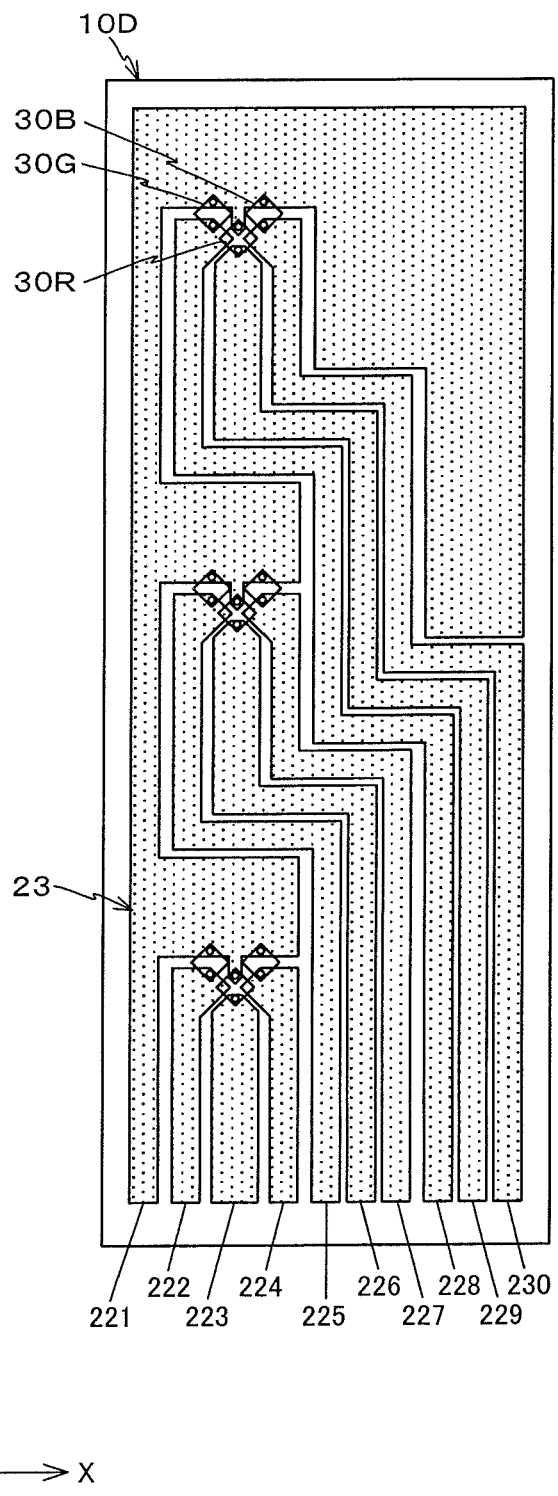
FIG. 20 is a plan view illustrating the light emitting module according to a modified example.

In FIG. 20, the mesh pattern 221 covers a margin region that does not function as a wiring. It is appropriate if a conductive pattern is not provided at such a region that does not serve as a wiring, but in order to accomplish the equal transmissivity between the region where the mesh pattern, etc., is provided and the region where no wiring is formed, a wiring like a conductive pattern may be extended to a region which does not originally need a wiring and which does not serve as a wiring, or an isolated dummy pattern formed of the same material as that of the wiring like the conductive pattern may be provided at such a region. The dummy pattern can be provided between two wiring portions.

Several embodiments of the present disclosure have been explained, but those embodiments are merely presented as examples, and are not intended to limit the scope of the present disclosure. Such novel embodiments can be carried out in other various forms, and various omissions, replacements, and modifications can be made thereto without departing from the scope of the present disclosure. Those embodiments and the modified forms thereof are within the scope and spirit of the present disclosure, and also within the scope of the invention as recited in appended claims and the equivalent range thereto.

The invention claimed is:

1. A light emitting module comprising:
a first insulation film with a light transmissivity;
a second insulation film with a light transmissivity disposed to face the first insulating film;

a first double sided light emitting element disposed between the first insulating film and the second insulating film, and having a pair of electrodes on one surface of the first double sided light emitting element;

a second double sided light emitting element disposed between the first insulating film and the second insulating film, and having a pair of electrodes on one surface of the second double sided light emitting element, said second double sided light emitting element disposed adjacent to said first double sided light emitting element;

at least a first conducting area and a second conducting area formed on said first insulating film, said first conducting area connecting a first electrode of said first double sided light emitting element and a first electrode of said second double sided light emitting element as a common pattern, the common pattern having one common end, said second conducting area having a first individual conducting pattern connected to a second electrode of said first double sided light emitting element, and having a second individual conducting pattern connected to a second electrode of said second double sided light emitting element, the first individual conducting pattern and the second individual conducting pattern each having an individual end.

2. The light emitting module according to claim 1, comprising:

a resin layer disposed between the first insulation film and the second insulation film, the resin layer having a plurality of spaces in which the first and second double sided light emitting elements are respectively disposed.

3. The light emitting module according to claim 1, wherein the common pattern is arranged on one side of the first and second double sided light emitting elements, and the individual conductor patterns are arranged on the other side of the plurality of double sided light emitting elements.

4. The light emitting module according to claim 1, wherein the common pattern is connected to respective anodes of the plurality of double sided light emitting elements, and the first and second individual conducting patterns are connected to respective cathodes of the first and second double sided light emitting elements.

5. The light emitting module according to claim 1, wherein the first and second double sided light emitting elements are arranged at equal intervals with respect to the common pattern.

6. The light emitting module according to claim 1, wherein the first and second individual conducting patterns are arranged at equal intervals.

7. The light emitting module according to claim 1, wherein the first and second double sided light emitting elements include double sided light-emitting elements that emit light of respective different colors.

8. A light emitting module comprising:

a first insulation film with a light transmissivity;

a second insulation film with a light transmissivity disposed to face the first insulating film; and a plurality of light emitting systems arranged apart from each other, each of said plurality of light emitting systems comprising, a light emitting element group comprising at least first and second double sided light emitting elements the first double sided light emitting element disposed between the first insulating film and the second insulating film, and having a pair of electrodes on one surface of the first double sided light emitting element;

the second double sided light emitting element disposed between the first insulating film and the second insulating film, and having a pair of electrodes on one surface of the second double sided light emitting element, said second double sided light emitting element disposed adjacent to said first double sided light emitting element, at least a first conducting area and a second conducting area formed on said first insulating film, said first conducting area connecting a first electrode of said first double sided light emitting element of a first light emitting system and a first electrode of said second double sided light emitting element of the first light emitting system as a common pattern, the common pattern having one common end, said second conducting area having a first individual conducting pattern connected to a second electrode of said first double sided light emitting element of the first light emitting system, and having a second individual conducting pattern connected to a second electrode of said second double sided light emitting element of the first light emitting system, the first individual conducting pattern and the second individual conducting pattern each having an individual end.

\* \* \* \* \*